US012777700B2

(12) United States Patent
Lien et al.

(10) Patent No.: US 12,777,700 B2
(45) Date of Patent: Oct. 27, 2026

(54) HIGH ELECTRON MOBILITY TRANSISTOR AND FABRICATION METHOD THEREOF

(71) Applicant: Vanguard International Semiconductor Corporation, Hsinchu (TW)

(72) Inventors: Yi-Wei Lien, Hsinchu City (TW); Wei-Chih Cheng, Tainan City (TW); Shyh-Chiang Shen, Taipei City (TW); Hsin-Chang Tsai, Kaohsiung City (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 642 days.

(21) Appl. No.: 18/097,286

(22) Filed: Jan. 16, 2023

(65) Prior Publication Data

US 2024/0178285 A1 May 30, 2024

(30) Foreign Application Priority Data

Nov. 30, 2022 (TW) ................................ 111145878

(51) Int. Cl.
*H10D 64/00* (2025.01)
*H10D 30/01* (2025.01)
(Continued)

(52) U.S. Cl.
CPC ......... *H10D 64/118* (2025.01); *H10D 30/015* (2025.01); *H10D 30/475* (2025.01);
(Continued)

(58) Field of Classification Search
CPC .. H10D 64/118; H10D 30/015; H10D 30/475; H10D 62/8503; H10D 64/01;
(Continued)

(56) References Cited

U.S. PATENT DOCUMENTS 11,121,245 B2 9/2021 Cao
11,201,234 B1 * 12/2021 Huang ................... H10D 30/47
(Continued)

FOREIGN PATENT DOCUMENTS

CN 101752430 A 6/2010
CN 105322005 A 2/2016
(Continued)

*Primary Examiner* — Shahed Ahmed
(74) *Attorney, Agent, or Firm* — Winston Hsu

(57) ABSTRACT

A high electron mobility transistor includes a semiconductor channel layer and a semiconductor barrier layer disposed on a substrate. A source electrode, a gate electrode and a drain electrode are disposed on the semiconductor channel layer. A patterned dielectric layer is disposed on the semiconductor barrier layer, and between the gate electrode and the drain electrode. A first field plate is extended continuously from a side of the patterned dielectric layer to the top surface thereof, and has a step in height. A first dielectric layer is disposed between the semiconductor barrier layer and the patterned dielectric layer. A second dielectric layer covers the patterned dielectric layer. The dielectric constant of the patterned dielectric layer is higher than that of the first dielectric layer and the second dielectric layer.

9 Claims, 10 Drawing Sheets

(51) Int. Cl.
*H10D 30/47* (2025.01)
*H10D 62/85* (2025.01)
*H10D 64/01* (2025.01)

(52) U.S. Cl.
CPC ......... *H10D 62/8503* (2025.01); *H10D 64/01* (2025.01); *H10D 64/112* (2025.01)

(58) Field of Classification Search
CPC ......... H10D 64/112; H10D 30/47–485; H10D 64/111–117
See application file for complete search history.

(56) References Cited

U.S. PATENT DOCUMENTS

| | | | | |
|---|---|---|---|---|
| 2016/0343833 | A1 | 11/2016 | Huang | |
| 2022/0148938 | A1* | 5/2022 | Lin | H10D 30/475 |
| 2023/0335630 | A1* | 10/2023 | Lin | H10D 64/112 |
| 2024/0105826 | A1* | 3/2024 | Kobayashi | H10D 30/475 |
| 2024/0113175 | A1* | 4/2024 | Yasuzumi | H10D 62/8503 |
| 2025/0185274 | A1* | 6/2025 | Bisi | H10D 64/518 |

FOREIGN PATENT DOCUMENTS

| | | | |
|---|---|---|---|
| CN | 113725286 | A | 11/2021 |
| CN | 114664938 | A | 6/2022 |

* cited by examiner

HIGH ELECTRON MOBILITY TRANSISTOR AND FABRICATION METHOD THEREOF

BACKGROUND OF THE INVENTION

1. Field of the Invention

The present disclosure relates generally to semiconductor devices, and more particularly to high electron mobility transistors and fabrication methods thereof.

2. Description of the Prior Art

In semiconductor technology, group III-V compound semiconductors may be used to construct various integrated circuit (IC) devices, such as high-power field-effect transistors (FETs), high-frequency transistors, or high electron mobility transistors (HEMTs). A HEMT is a field effect transistor having a two-dimensional electron gas (2DEG) layer close to a junction between two materials with different energy gaps (i.e., a hetero-junction). The 2DEG layer is used as the transistor channel instead of a doped region, as is generally the case for metal oxide semiconductor field effect transistors (MOSFETs). Compared with MOSFETS, HEMTs have a number of attractive properties, such as high electron mobility and the ability to transmit signals at high frequencies. In the conventional HEMTs, a field plate may be provided to regulate the electric field distribution for increasing the breakdown voltage of the HEMTs. However, the process steps of manufacturing the conventional HEMTs are complicated and the manufacturing cost is increased.

SUMMARY OF THE INVENTION

In view of this, the present disclosure provides high electron mobility transistors (HEMTs) and fabrication methods thereof. In the HEMTs, a patterned dielectric layer is disposed between a gate electrode and a drain electrode. The patterned dielectric layer is used for forming a field plate with a step in height, thereby achieving the effect of multiple field plates though the same conductive material layer. Moreover, patterning the same conductive material layer may form a field plate, a source electrode and a drain electrode at the same time. Alternatively, patterning the same conductive material layer may form a field plate and a gate electrode at the same time. In addition, the dielectric constant of the patterned dielectric layer is higher than that of the dielectric layers around the patterned dielectric layer, thereby redistributing the electric field to enhance the breakdown voltage of the HEMTs.

According to an embodiment of the present disclosure, a high electron mobility transistor is provided and includes a substrate, a semiconductor channel layer, a semiconductor barrier layer, a source electrode, a gate electrode, a drain electrode, a patterned dielectric layer, a first field plate, a first dielectric layer and a second dielectric layer. The semiconductor channel layer and the semiconductor barrier layer are disposed on the substrate. The source electrode, the gate electrode and the drain electrode are disposed on the semiconductor channel layer. The patterned dielectric layer is disposed on the semiconductor barrier layer and located between the gate electrode and the drain electrode. The first field plate is extended continuously from a side of the patterned dielectric layer to the top surface of the patterned dielectric layer, and has a step in height. The first dielectric layer is disposed between the semiconductor barrier layer and the patterned dielectric layer. The second dielectric layer covers the patterned dielectric layer. The dielectric constant of the patterned dielectric layer is higher than both the dielectric constant of the first dielectric layer and the dielectric constant of the second dielectric layer.

According to an embodiment of the present disclosure, a method of fabricating a high electron mobility transistor is provided and includes the following steps. A substrate is provided, and a semiconductor channel layer and a semiconductor barrier layer are formed on the substrate in sequence. A patterned dielectric layer is formed on the semiconductor barrier layer. A first conductive material layer is deposited on the semiconductor barrier layer and the patterned dielectric layer. The first conductive material layer is patterned to form a source electrode, a drain electrode and a first field plate. A dielectric layer is formed to conformally cover the patterned dielectric layer and the first field plate. A second conductive material layer is deposited on the dielectric layer. In addition, the second conductive material layer is patterned to form a gate electrode and a second field plate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
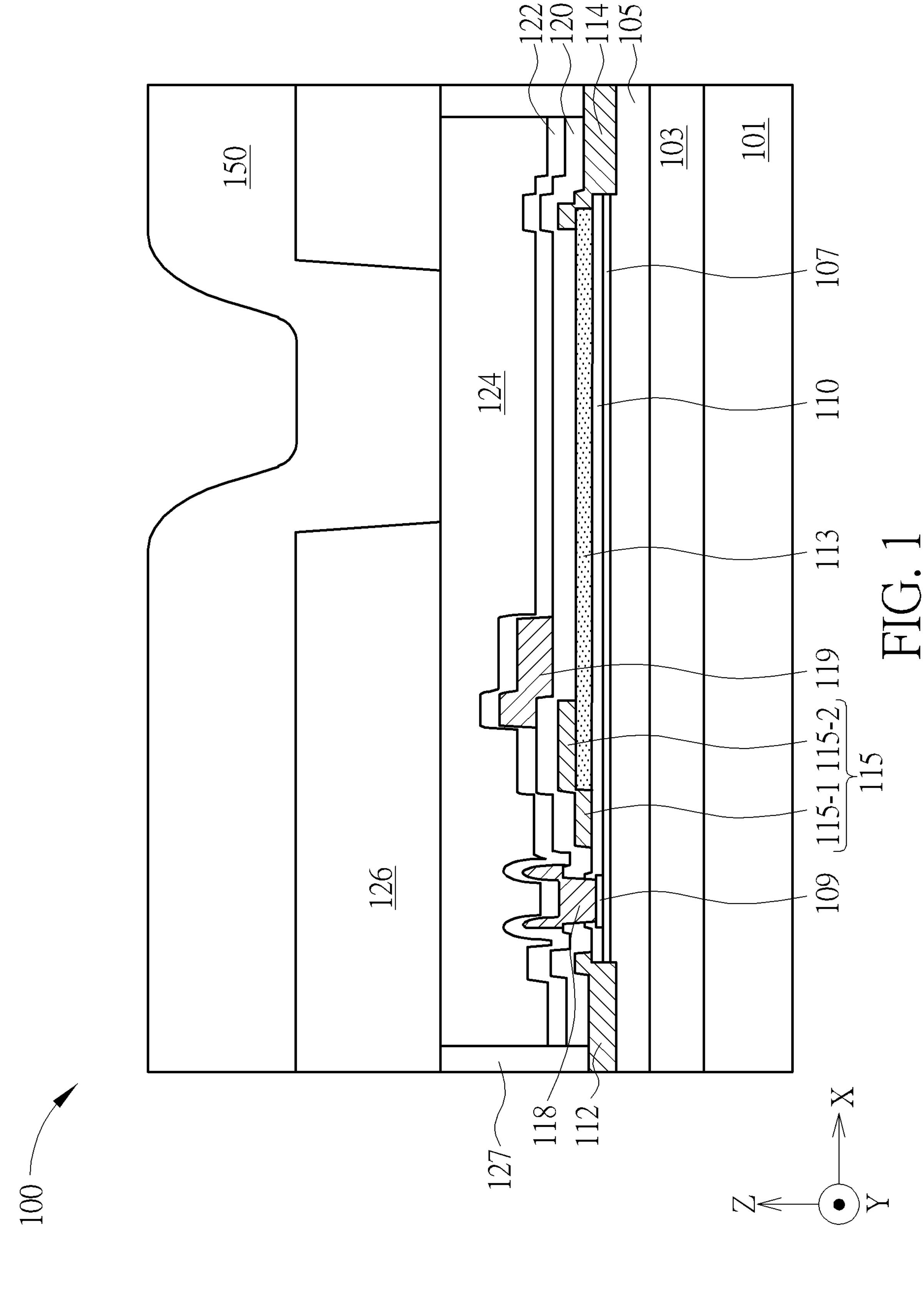
FIG. 1 is a schematic cross-sectional view of a high electron mobility transistor (HEMT) according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “under,” “lower,” “over,” “above,” “on,” “upper” and the like, may be used herein for ease of description to describe one element or feature’s relationship to another element (s) or feature (s) as illustrated in the figures. The spatially relative terms are intended to encompass different orientations of the device in use or operation in addition to the orientation depicted in the figures. For example, if the device in the figures is turned over, elements described as “below” and/or “beneath” other elements or features would then be oriented “above” and/or “over” the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as “first,” “second,” and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term “about” or “substantial” generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term “about” or “substantial”. Accordingly, unless indicated to the contrary, the numerical parameters set forth in the present disclosure and attached claims are approximations that can vary as desired.

Furthermore, as disclosed herein, the terms “coupled to” and “electrically connected to” include any directly and indirectly electrical connecting means. Therefore, if it is described in this document that a first component is coupled or electrically connected to a second component, it means that the first component may be directly connected to the second component, or may be indirectly connected to the second component through other components or other connecting means.

In the present disclosure, a “compound semiconductor” refers to a group III-V compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, or the like, or the combination thereof. Besides, based on different requirements, compound semiconductor may contain dopants to become semiconductor with specific conductivity type, such as n-type or p-type.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to high electron mobility transistors (HEMTs) having a field plate and fabrication methods thereof. In the HEMTs, a patterned dielectric layer is disposed between a gate electrode and a drain electrode. The patterned dielectric layer is used for forming a field plate with a step in height, thereby achieving the effect of multiple field plates through the same conductive material layer (such as a metal layer). In addition, the dielectric constant of the patterned dielectric layer is higher than that of the dielectric layers around the patterned dielectric layer, thereby redistributing the electric field to reduce the maximum electric field intensity at the edge of the gate electrode, and further improving the breakdown voltage of the HEMTs. Moreover, according to the embodiments of the present disclosure, a source electrode, a drain electrode, and a field plate with a step in height are simultaneously formed in some process steps, and a gate electrode and another field plate with a step in height are also simultaneously formed in other process steps. Accordingly, in the fabrication of the HEMTs, the number of photo-masks required to be used is decreased, thereby reducing the manufacturing costs.

FIG. 1 is a schematic cross-sectional view of a high electron mobility transistor (HEMT) 100 according to an embodiment of the present disclosure. The HEMT 100 includes a substrate 101. In some embodiments, the material of the substrate 101 may include ceramic, silicon carbide (SiC), aluminum nitride (AlN), sapphire or silicon. When the substrate 101 is made of a material with high hardness, high thermal conductivity and low electrical conductivity, such as a ceramic substrate, it is more suitable for high-voltage semiconductor devices. The aforementioned high hardness, high thermal conductivity and low electrical conductivity of the substrate are compared with a single-crystal silicon substrate, and the high-voltage semiconductor devices refer to semiconductor devices with an operating voltage higher than 50V. In some embodiments, the substrate 101 may be a semiconductor-on-insulator (SOI) substrate. In some other embodiments, the substrate 101 may be provided by a composite substrate (or referred to as a QST substrate) composed of a core substrate wrapped around by a composite material layer. The composition of the core substrate includes ceramic, silicon carbide, aluminum nitride, sapphire or silicon. The composite material layer includes an insulating material layer and a semiconductor material layer. The insulating material layer may be single or multiple layers of silicon oxide, silicon nitride or silicon oxynitride. The semiconductor material layer may be silicon or polysilicon. In addition, during the fabrication of the HEMTs, the composite material layer on the backside of the core substrate may be removed by a thinning process, such as a grinding or an etching process, so that the backside of the core substrate is exposed.

In addition, the HEMT 100 includes a buffer layer 103, a semiconductor channel layer 105, and a semiconductor barrier layer 107 stacked on the substrate 101 in sequence from bottom to top. The buffer layer 103 may be used to reduce the degree of stress or lattice mismatch between the substrate 101 and the semiconductor channel layer 105. In some embodiments, a nucleation layer may be disposed between the buffer layer 103 and the substrate 101. A high resistance layer (or referred to as an electrical isolation layer) may be disposed between the buffer layer 103 and the semiconductor channel layer 105. The materials of the nucleation layer, the buffer layer 103, the high resistance layer, the semiconductor channel layer 105 and the semiconductor barrier layer 107 include compound semiconductors. In some embodiments, the nucleation layer is, for example, an aluminum nitride (AlN) layer. The buffer layer 103 may be a superlattice (SL) structure, for example, including a plurality of alternately stacked aluminum gallium nitride (AlGaN) layers and aluminum nitride (AlN) layers. The high resistance layer is, for example, a carbon-doped gallium nitride (C—GaN) layer. In some embodiments, the semiconductor channel layer 105 is, for example, an undoped gallium nitride (u-GaN) layer. The semiconductor barrier layer 107 is a compound semiconductor layer with an energy gap greater than that of the semiconductor channel layer 105, for example, an aluminum gallium nitride (AlGaN) layer. The materials of the aforementioned layers are for example, but not limited thereto. Moreover, the compositions and structural arrangements of the aforementioned compound semiconductor layers of the HEMT 100 may be determined according to the requirements of various electronic components.

Still referring to FIG. 1, the HEMT 100 includes a source electrode 112, a gate electrode 118 and a drain electrode 114 disposed on the semiconductor channel layer 105. In some embodiments, the source electrode 112 and the drain electrode 114 may be extended downward to pass through the semiconductor barrier layer 107 and into the semiconductor channel layer 105. In other embodiments, the source electrode 112 and the drain electrode 114 may pass through the semiconductor barrier layer 107 to be disposed on the top surface of the semiconductor channel layer 105. In further other embodiments, the source electrode 112 and the drain electrode 114 may be disposed on the top surface of the semiconductor barrier layer 107. In addition, a semiconductor cap layer 109 may be disposed on the semiconductor barrier layer 107, and the gate electrode 118 is disposed on the semiconductor cap layer 109 to construct an enhancement-mode HEMT. In one embodiment, the semiconductor cap layer 109 is, for example, a p-type gallium nitride (p-GaN) layer. According to some embodiments of the present disclosure, a first dielectric layer 110 is disposed on the semiconductor barrier layer 107, and the semiconductor cap layer 109 is disposed in the first dielectric layer 110. In addition, the HEMT 100 further includes a patterned dielectric layer 113 disposed on the first dielectric layer 110 and located between the gate electrode 118 and the drain electrode 114. The first dielectric layer 110 is disposed between the semiconductor barrier layer 107 and the patterned dielectric layer 113.

As shown in FIG. 1, the HEMT 100 further includes a first field plate 115 extended continuously from one side (for example, the left side) of the patterned dielectric layer 113 to the top surface of the patterned dielectric layer 113, and having a step in height. A first portion 115-1 of the first field plate 115 is on the semiconductor barrier layer 107 and abuts the aforementioned side of the patterned dielectric layer 113. A second portion 115-2 of the first field plate 115 is on the top surface of the patterned dielectric layer 113. Accordingly, the distance between the first portion 115-1 of the first field plate 115 and the semiconductor barrier layer 107 is different from the distance between the second portion 115-2 of the first field plate 115 and the semiconductor barrier layer 107. Therefore, the first field plate 115 has the effect of two field plates. In this embodiment, the patterned dielectric layer 113 is extended continuously from the first field plate 115 to the drain electrode 114. A portion of the drain electrode 114 is extended from another side (for example, the right side) of the patterned dielectric layer 113 to the top surface of the patterned dielectric layer 113. In one embodiment, the patterned dielectric layer 113 may be formed by stacking a plurality of dielectric material layers, and these dielectric material layers may have different dielectric constants, respectively. Moreover, the stack of these dielectric material layers may construct a stepped structure, so that the first field plate 115 conformally deposited on the patterned dielectric layer 113 has the effect of multiple field plates.

As shown in FIG. 1, the HEMT 100 includes a second dielectric layer 120 covering the first field plate 115, the patterned dielectric layer 113, the source electrode 112 and the drain electrode 114. The second dielectric layer 120 is conformally formed on the first field plate 115 and the patterned dielectric layer 113, thereby having an undulating surface profile with ups and downs.

According to some embodiments of the present disclosure, the dielectric constant of the patterned dielectric layer 113 is higher than the dielectric constant of the first dielectric layer 110 and the dielectric constant of the second dielectric layer 120. In one embodiment, the composition of the patterned dielectric layer 113 is, for example, silicon nitride (SiNx), and the compositions of the first dielectric layer 110 and the second dielectric layer 120 are, for example, silicon oxide ($SiO_2$), but not limited thereto. The dielectric constant of the patterned dielectric layer 113 is sufficiently higher than that of the dielectric layers (for example, the first dielectric layer 110 and the second dielectric layer 120) around the patterned dielectric layer 113. The patterned dielectric layer 113 has a relatively high dielectric constant, thereby increasing the electric field intensity on the surface of the semiconductor barrier layer 107 directly under the patterned dielectric layer 113. Furthermore, the electric field is redistributed by the first field plate 115, thereby reducing the electric field intensity at the edge of the gate electrode 118, and further enhancing the breakdown voltage of the HEMT.

According to some embodiments of the present disclosure, the patterned dielectric layer 113 is formed of a material with a high dielectric constant, and the dielectric constant of the patterned dielectric layer 113 is higher than that of the dielectric layers around the patterned dielectric layer 113. For example, when the dielectric layers around the patterned dielectric layer 113 are formed of silicon oxide (with the dielectric constant of 3.9), the composition of the patterned dielectric layer 113 is, for example, silicon nitride ($Si_3N_4$), yttrium oxide ($Y_2O_3$), yttrium titanium oxide ($Y_2TiO_5$), ytterbium oxide ($Yb_2O_3$), hafnium oxide ($HfO_2$), zirconium oxide ($ZrO_2$), titanium oxide ($TiO_2$), aluminum oxide ($Al_2O_3$), tantalum oxide ($Ta_2O_5$), silicon oxynitride ($SiO_xN_y$) or other materials with a dielectric constant higher than that of silicon oxide. Moreover, in one embodiment, the patterned dielectric layer 113 may be formed by stacking a plurality of dielectric material layers, and these dielectric material layers may have different dielectric constants, respectively. For example, the patterned dielectric layer 113 may be formed by stacking multiple layers of the aforementioned materials with a high dielectric constant.

In addition, the HEMT 100 may include a second field plate 119 disposed on the second dielectric layer 120 and directly above the patterned dielectric layer 113 and the second portion 115-2 of the first field plate 115. The second field plate 119 is conformally formed on the undulating surface of the second dielectric layer 120 to have a step in height, so that the second field plate 119 also has the effect of at least two field plates. Moreover, the HEMT 100 may further include interlayer dielectric layers 122 and 124 covering the gate electrode 118 and the second field plate 119. In addition, a first metal layer 126 is formed on the interlayer dielectric layer 124. Multiple vias 127 are formed in the interlayer dielectric layers 124 and 122 and the second dielectric layer 120. The first metal layer 126 is used as a wire layer, and electrically connected to the source electrode 112 and the drain electrode 114 through the multiple vias 127, respectively. Furthermore, a passivation layer 150 may be formed to cover the first metal layer 126 and protect the HEMT 100. The composition of the passivation layer 150 is, for example, silicon nitride, silicon oxynitride, other dielectric materials, insulating polymer (such as epoxy resin) or other insulating materials. According to an embodiment of the present disclosure, the first field plate 115 and the second field plate 119 are electrically connected to the source electrode 112. Moreover, the source electrode 112 may be electrically coupled to a ground terminal, thereby further reducing the maximum electric field intensity and improving the breakdown voltage of the HEMT.

Figure 2:
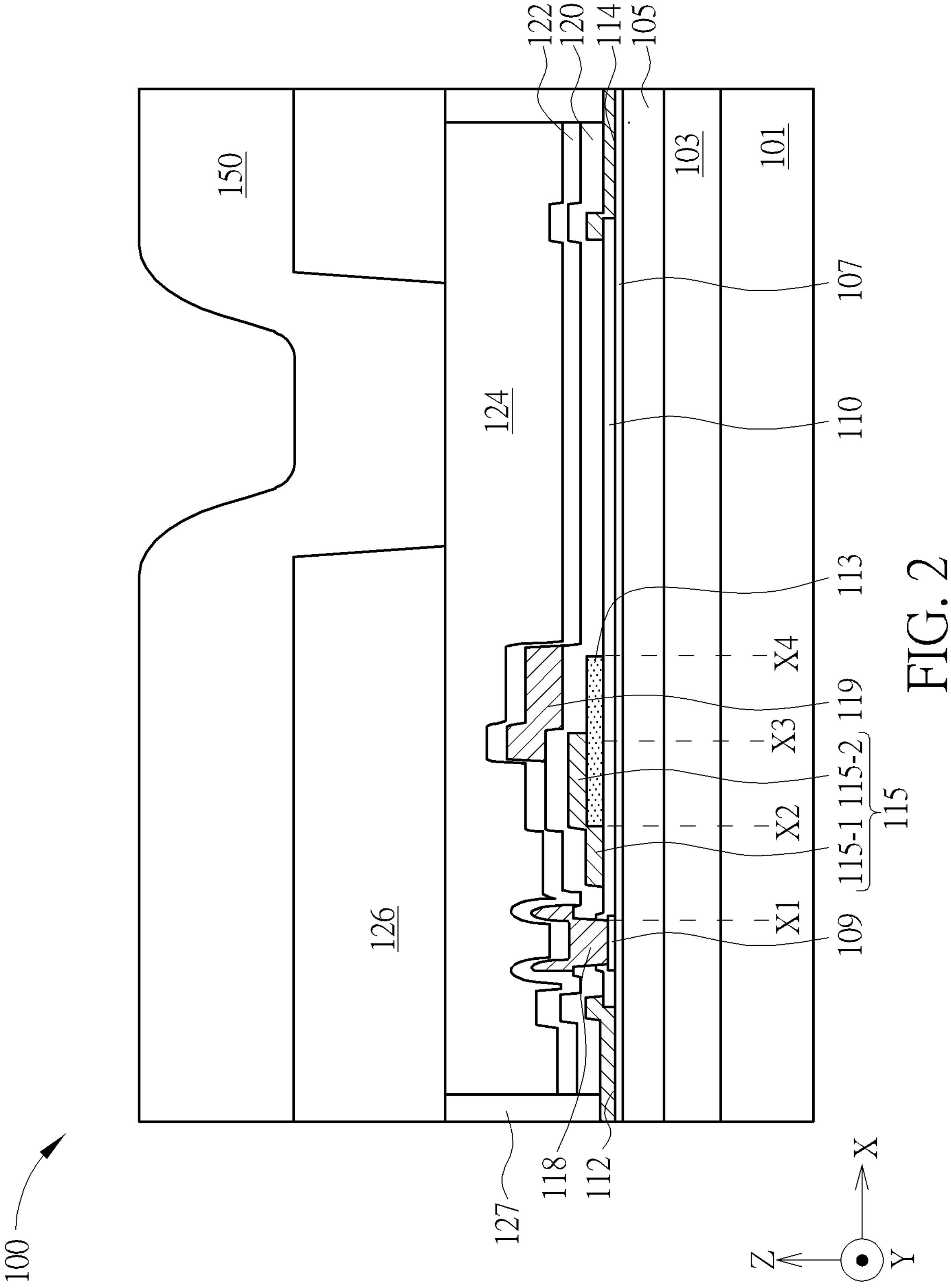
FIG. 2 is a schematic cross-sectional view of a HEMT according to another embodiment of the present disclosure.

FIG. 2 is a schematic cross-sectional view of a HEMT 100 according to another embodiment of the present disclosure. In the HEMT 100 of FIG. 2, the patterned dielectric layer 113 is not extended continuously from the first field plate 115 to the drain electrode 114. As shown in FIG. 2, one side (for example, the left side) of the patterned dielectric layer 113 abuts the first field plate 115, and another side (for example, the right side) of the patterned dielectric layer 113 is not adjacent to the first field plate 115. Moreover, the right side of the patterned dielectric layer 113 is not covered by the drain electrode 114. The right side of the patterned dielectric layer 113 is laterally separated from the drain electrode 114 by a distance. A portion of the drain electrode 114 is extended onto the top surface of the first dielectric layer 110. In one embodiment, the right side of the patterned dielectric layer 113 may be substantially vertically aligned with an edge (for example, the right edge) of the second field plate 119. In other embodiments, the right side of the patterned dielectric layer 113 may be shifted toward the right or left of an edge (for example, the right edge) of the second field plate 119. When the right side of the patterned dielectric layer 113 is shifted toward the left, the second field plate 119 may have two steps in height, thereby having the effect of three field plates.

Figure 3:
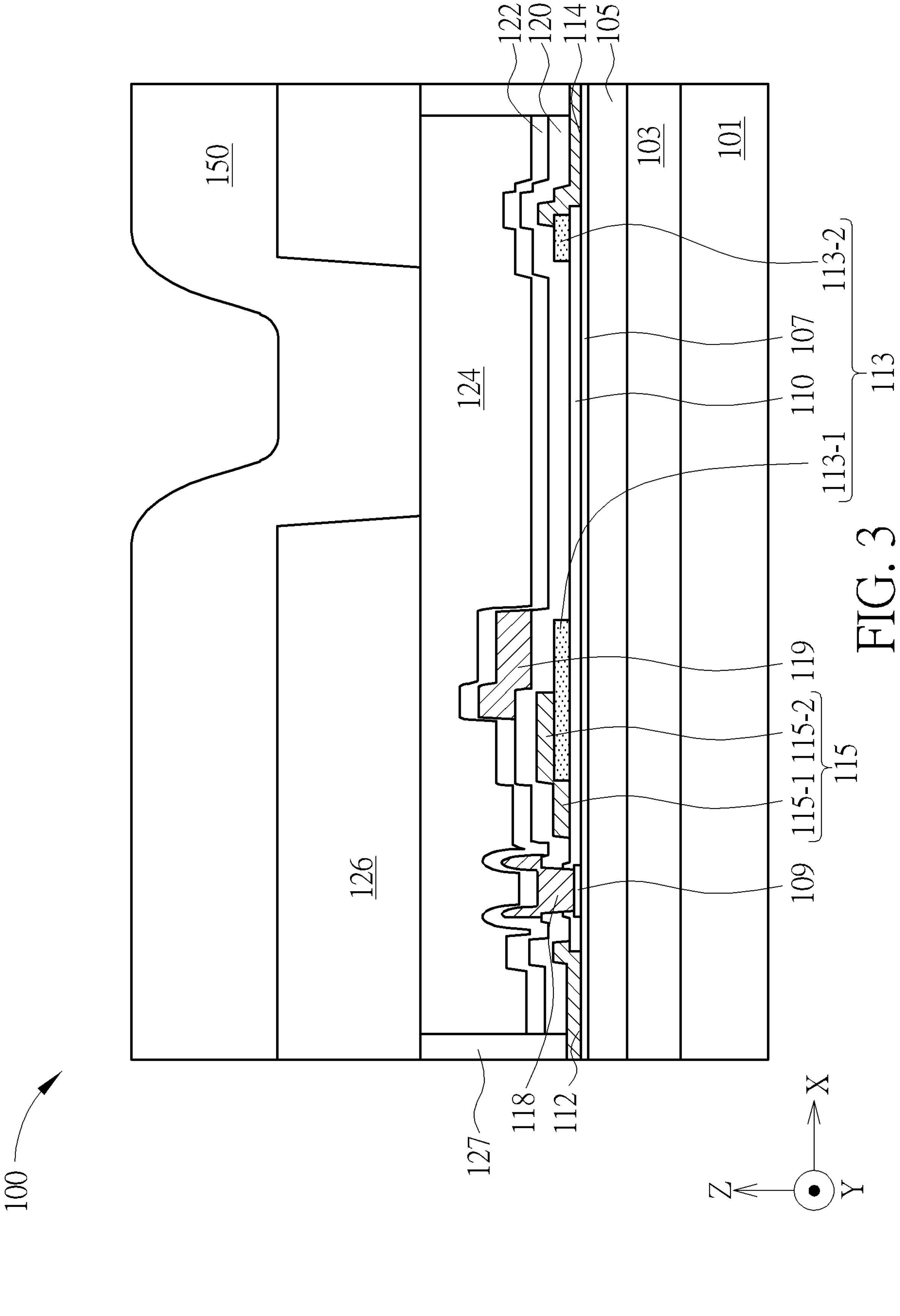
FIG. 3 is a schematic cross-sectional view of a HEMT according to further another embodiment of the present disclosure.

FIG. 3 is a schematic cross-sectional view of a HEMT 100 according to further another embodiment of the present disclosure. In the HEMT 100 of FIG. 3, the patterned dielectric layer 113 includes a first dielectric segment 113-1 and a second dielectric segment 113-2 laterally separated from each other. The second dielectric segment 113-2 is adjacent to the drain electrode 114. A portion of the drain electrode 114 is extended from one side of the second dielectric segment 113-2 to the top surface of the second dielectric segment 113-2. In one embodiment, the first dielectric segment 113-1 and the second dielectric segment 113-2 may have the same composition. In another embodiment, the composition of the first dielectric segment 113-1 and the second dielectric segment 113-2 are different from each other and different have dielectric constants, respectively. Both the dielectric constants of the first dielectric segment 113-1 and the second dielectric segment 113-2 are higher than the dielectric constant of the first dielectric layer 110 and the dielectric constant of the second dielectric layer 120.

Figure 4:
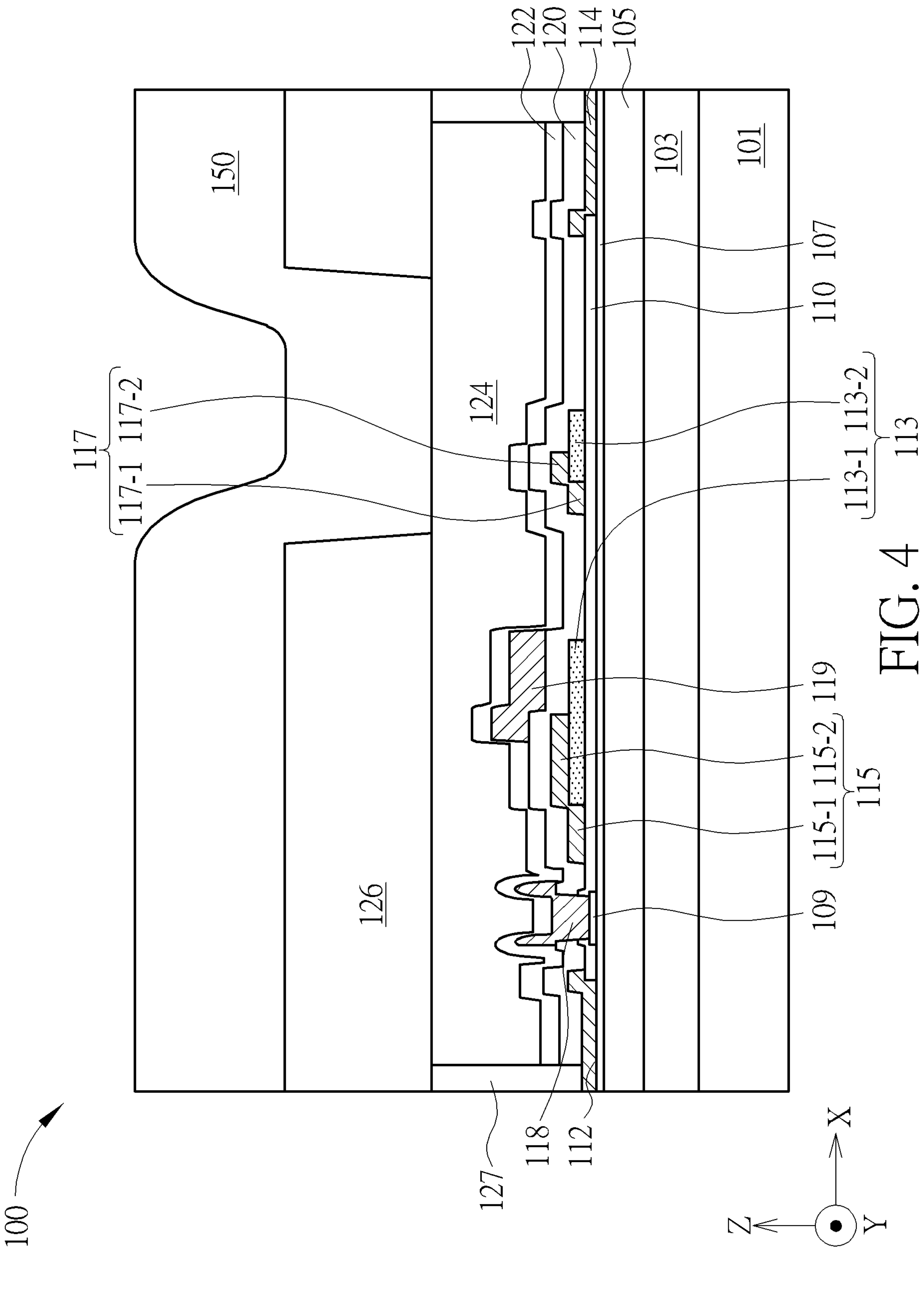
FIG. 4 is a schematic cross-sectional view of a HEMT according to yet another embodiment of the present disclosure.

FIG. 4 is a schematic cross-sectional view of a HEMT 100 according to yet another embodiment of the present disclosure. In the HEMT 100 of FIG. 4, the patterned dielectric layer 113 includes a first dielectric segment 113-1 and a second dielectric segment 113-2 laterally separated from each other. The second dielectric segment 113-2 is located between the first dielectric segment 113-1 and the drain electrode 114. Moreover, the second dielectric segment 113-2 is laterally separated from the drain electrode 114. The HEMT 100 of FIG. 4 further includes another field plate 117 extended continuously from one side of the second dielectric segment 113-2 to the top surface of the second dielectric segment 113-2. A first portion 117-1 of the field plate 117 is located on the semiconductor barrier layer 107 and abuts one side of the second dielectric segment 113-2. A second portion 117-2 of the field plate 117 is located on the top surface of the second dielectric segment 113-2. The first portion 117-1 and the second portion 117-2 of the field plate 117 have different distances from the semiconductor barrier layer 107, so that the field plate 117 has the effect of two field plates.

Figure 5:
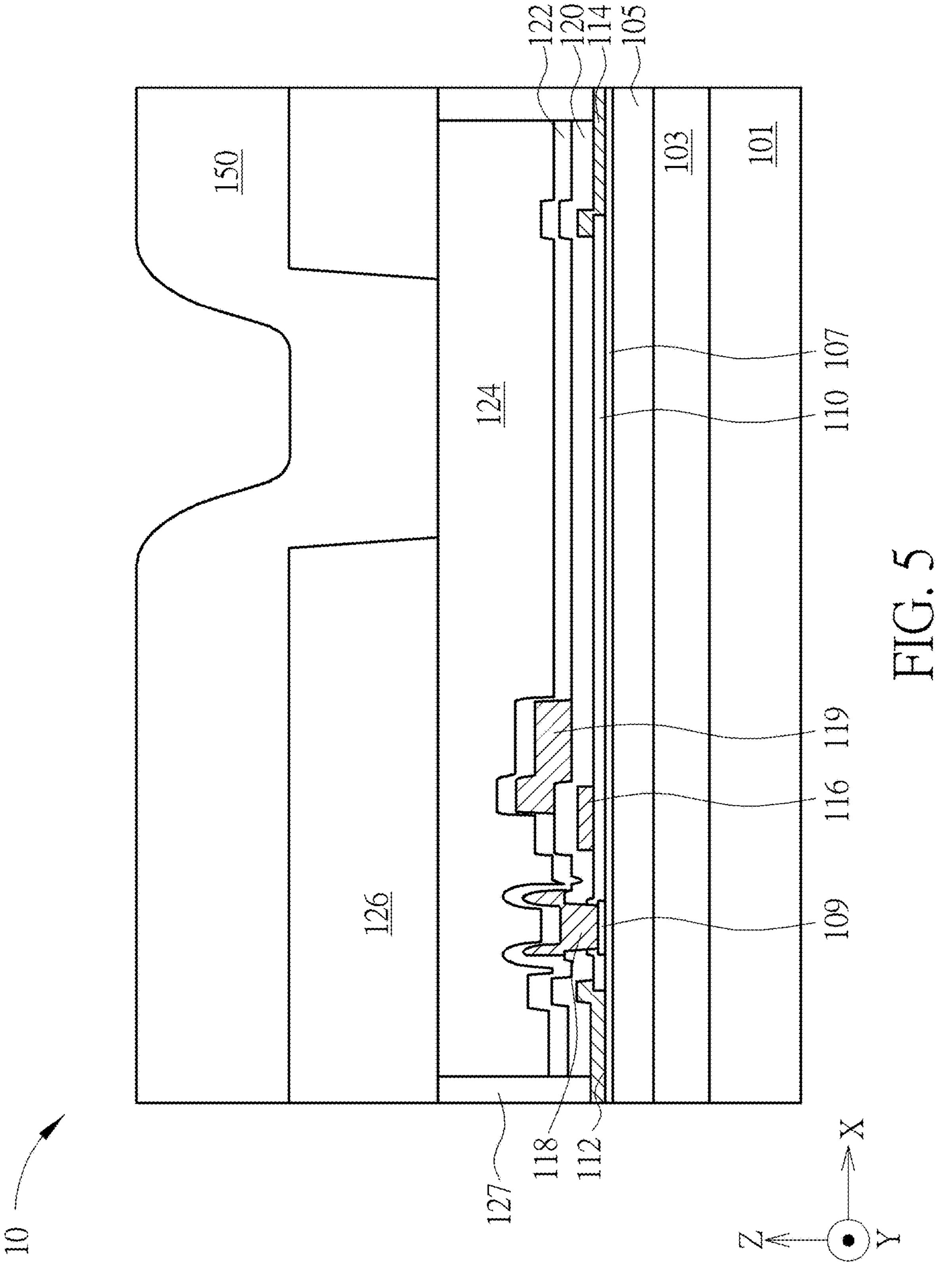
FIG. 5 is a schematic cross-sectional view of a HEMT according to another embodiment of the present disclosure.

FIG. 5 is a schematic cross-sectional view of a HEMT 10 according to an embodiment of the present disclosure. In the HEMT 10 of FIG. 5, there is no patterned dielectric layer 113. A field plate 116 of the HEMT 10 is formed on the flat top surface of the semiconductor barrier layer 107. The distance between the field plate 116 and the semiconductor barrier layer 107 is consistent, so that the field plate 116 does not have the effect of multiple field plates.

Figure 6:
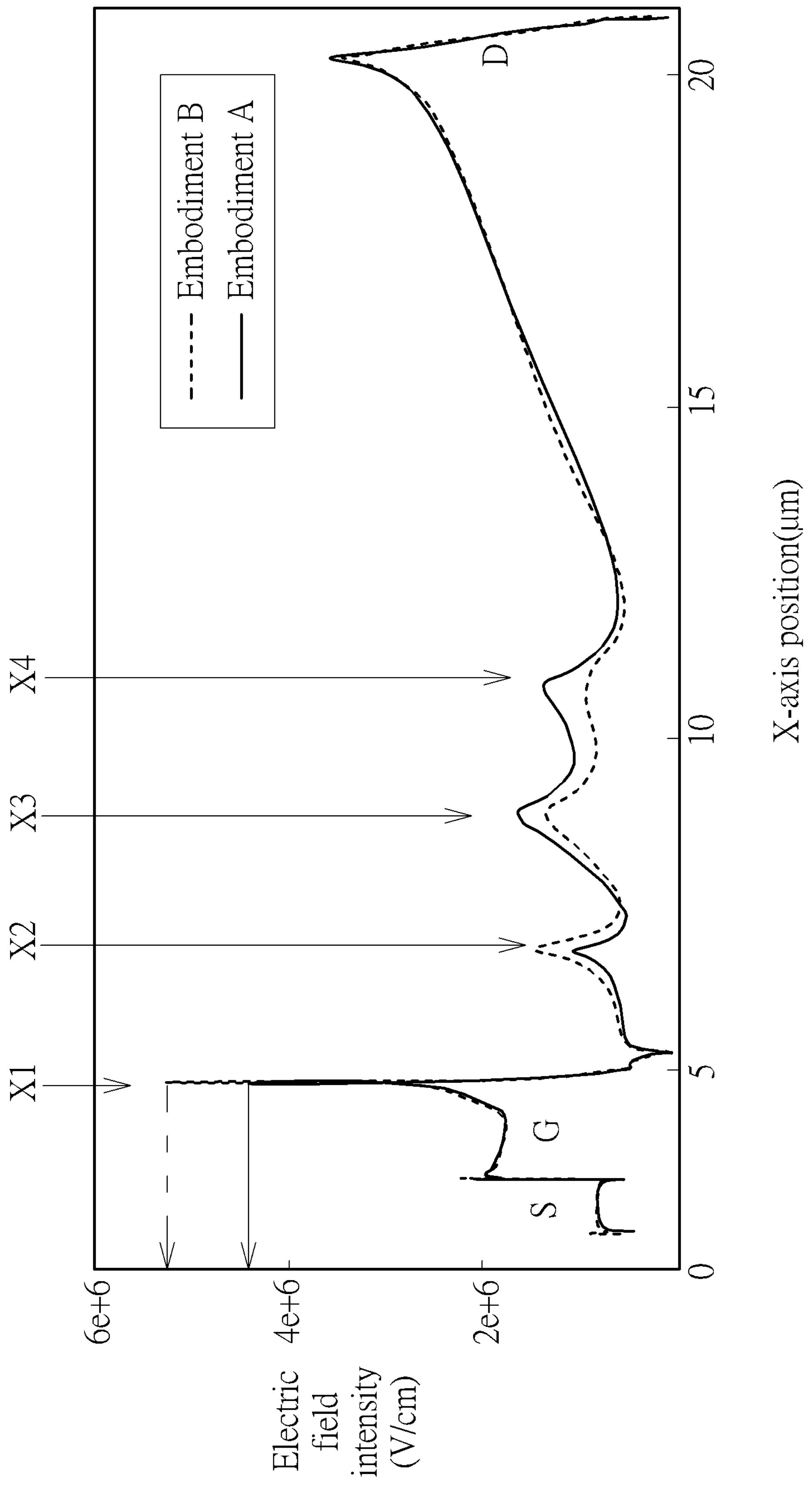
FIG. 6 is a graph showing the electric field intensity distribution on the surface of a semiconductor barrier layer of several HEMTs according to some embodiments of the present disclosure.

FIG. 6 is a graph showing the electric field intensity distribution on the surface of a semiconductor barrier layer of a HEMT according to some embodiments of the present disclosure. An embodiment A in FIG. 6 is the HEMT 100 of FIG. 2 including a patterned dielectric layer 113 with a dielectric constant (k value) greater than 4 (for example, a k value of 7.5). An embodiment B in FIG. 6 is the HEMT 100 of FIG. 2 including a patterned dielectric layer 113 with a k value less than or equal to 4 (for example, a k value of 3.5). In FIG. 6, the horizontal axis is the X-axis position with a unit of micrometer (μm), and the vertical axis is the electric field intensity with a unit of volt/centimeter (V/cm). The graph of FIG. 6 shows the electric field intensity distribution on the surface of the semiconductor barrier layer 107 of the HEMTs of the embodiments A and B. The positions of the electric field intensity distribution are taken along the X-axis across the source electrode S, the gate electrode G, the X-axis positions X1, X2, X3, and X4 until the drain electrode D, where the X-axis positions X1, X2, X3, and X4 refer to the positions of the labels X1, X2, X3, and X4 as shown in FIG. 2. The position of the label X1 corresponds to an edge of the gate electrode 118 close to the first field plate 115 or the field plate 116, and the X-axis position X1 is the position where the maximum electric field intensity is located. The positions of the labels X2, X3 and X4 respectively correspond to different locations at the patterned dielectric layer 113 of FIG. 2.

As shown in FIG. 6, compared with the peak values of the electric field intensity of the embodiment B at the X-axis positions X3 and X4, the peak values of the electric field intensity of the embodiment A at the X-axis positions X3 and X4 are higher. In the embodiment A, the dielectric constant of the patterned dielectric layer 113 is higher than the dielectric constants of its surrounding dielectric layers, thereby increasing the electric field intensity on the surface of the semiconductor barrier layer 107 and directly under the patterned dielectric layer 113. Moreover, the electric field is redistributed by the patterned dielectric layer 113, thereby reducing the peak values of the electric field intensity of the embodiment A at the X-axis positions X1 and X2. As shown in FIG. 6, the maximum electric field intensity of the embodiment A at the X-axis position X1 is lower than that of the embodiment B by about 1e+6 V/cm, thereby improving the breakdown voltage of the embodiment A. It is known that, according to some embodiments of the present disclosure, the placement of the patterned dielectric layer 113 in the HEMT 100 not only allows the field plate formed thereon to have the effect of multiple field plates, but also can redistribute the electric field by the patterned dielectric layer 113 with a higher dielectric constant, thereby enhancing the breakdown voltage of the HEMT, which is beneficial for applications at high voltages.

Figure 7:
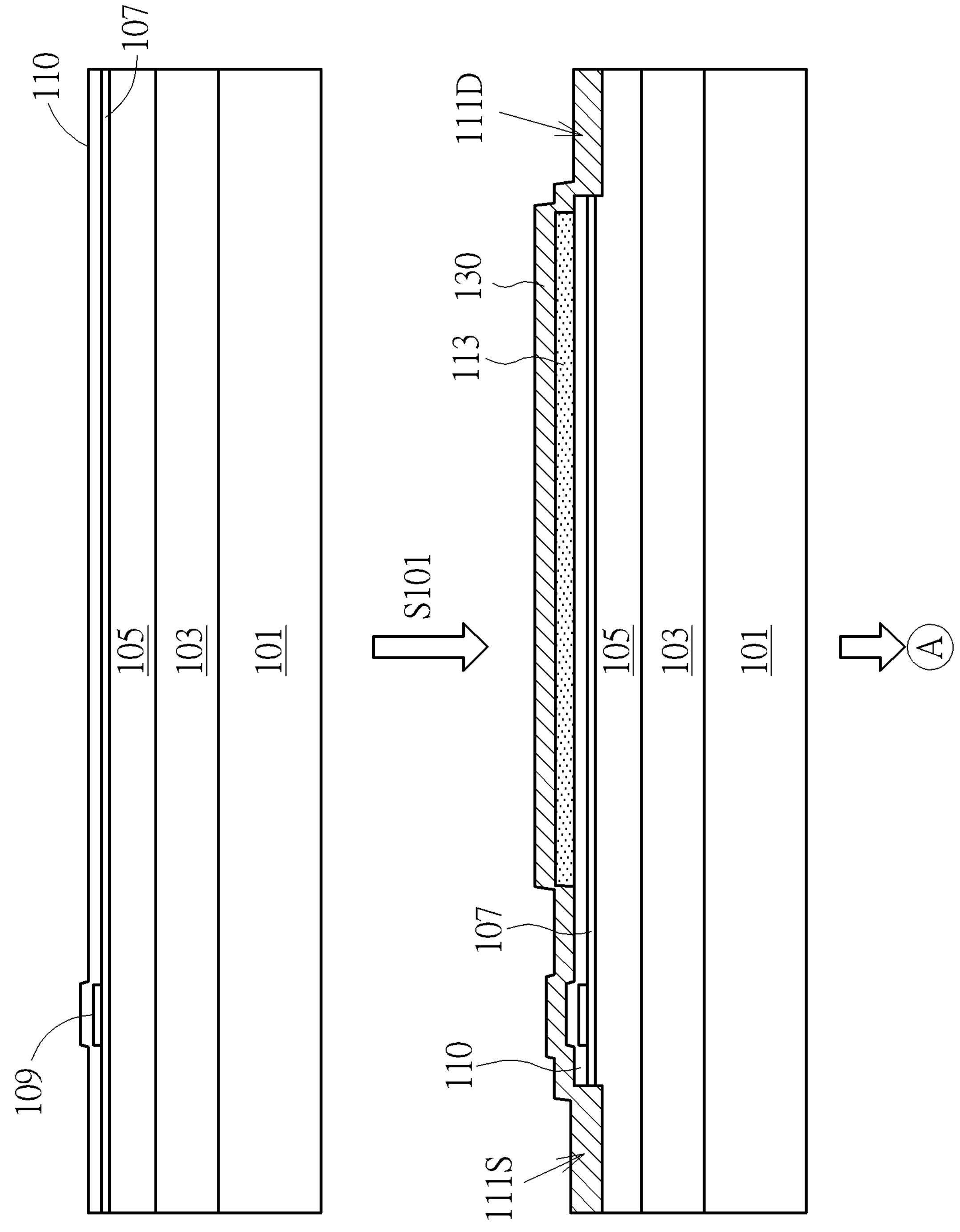
FIG. 7, FIG. 8, FIG. 9 and FIG. 10 are schematic cross-sectional views of some stages of a method of fabricating a HEMT according to an embodiment of the present disclosure.

FIG. 7, FIG. 8, FIG. 9 and FIG. 10 are schematic cross-sectional views of some stages of a method of fabricating a HEMT according to an embodiment of the present disclosure. Referring to FIG. 7, firstly, a substrate 101 is provided. Then, a buffer layer 103, a semiconductor channel layer 105 and a semiconductor barrier layer 107 are formed on the substrate 101 in sequence. A semiconductor cap layer 109 may be formed on the semiconductor barrier layer 107 by a deposition and a patterning processes. Afterwards, a first dielectric layer 110 is deposited to cover the semiconductor cap layer 109 and the semiconductor barrier layer 107. The compositions of the material layers mentioned in FIG. 7, FIG. 8, FIG. 9 and FIG. 10 may refer to the aforementioned description of FIG. 1, and will not be repeated here.

Still referring to FIG. 7, at step S101, a patterned dielectric layer 113 is formed on the semiconductor barrier layer 107 and the first dielectric layer 110 by a deposition and a patterning processes. Then, a source contact hole 111S and a drain contact hole 111D are formed in the first dielectric layer 110, the semiconductor barrier layer 107 and the semiconductor channel layer 105 by an etching process. According to an embodiment of the present disclosure, the patterned dielectric layer 113 is formed of a dielectric material with a dielectric constant higher than that of the dielectric layers around the patterned dielectric layer 113. For example, when the first dielectric layer 110 is formed of silicon oxide (with a dielectric constant of 3.9), the composition of the patterned dielectric layer 113 is, for example, silicon nitride ($Si_3N_4$) (with a dielectric constant of 7.5), but not limited thereto. In addition, in one embodiment, the patterned dielectric layer 113 may be formed by stacking a plurality of dielectric material layers, and these dielectric material layers have different dielectric constants, respectively.

In this embodiment, referring to FIG. 1, the patterned dielectric layer 113 is formed to be extended continuously from a subsequently formed first field plate 115 to a subsequently formed drain electrode 114. Moreover, according to different embodiments, different patterns of the patterned dielectric layer 113 may be formed by a patterning process. In some embodiments, referring to FIG. 3 and FIG. 4, a patterned dielectric layer 113 may be formed with a plurality of separate dielectric segments 113-1 and 113-2 located between a subsequently formed gate electrode 118 and the drain electrodes 114. In another embodiment, referring to FIG. 2, the patterned dielectric layer 113 is laterally separated from the drain electrode 114. The right side of the patterned dielectric layer 113 is located between the first field plate 115 and the drain electrode 114. Still referring to FIG. 7, at step S101, a first conductive material layer 130 is deposited on the semiconductor barrier layer 107, the patterned dielectric layer 113 and the first dielectric layer 110. Moreover, the first conductive material layer 130 fills up the source contact hole 111S and the drain contact hole 111D. In some embodiments, the composition of the first conductive material layer 130 is, for example, titanium (Ti), aluminum (Al), nickel (Ni), molybdenum (Mo), gold (Au) or a multi-layered stack of the aforementioned metal layers.

Figure 8:
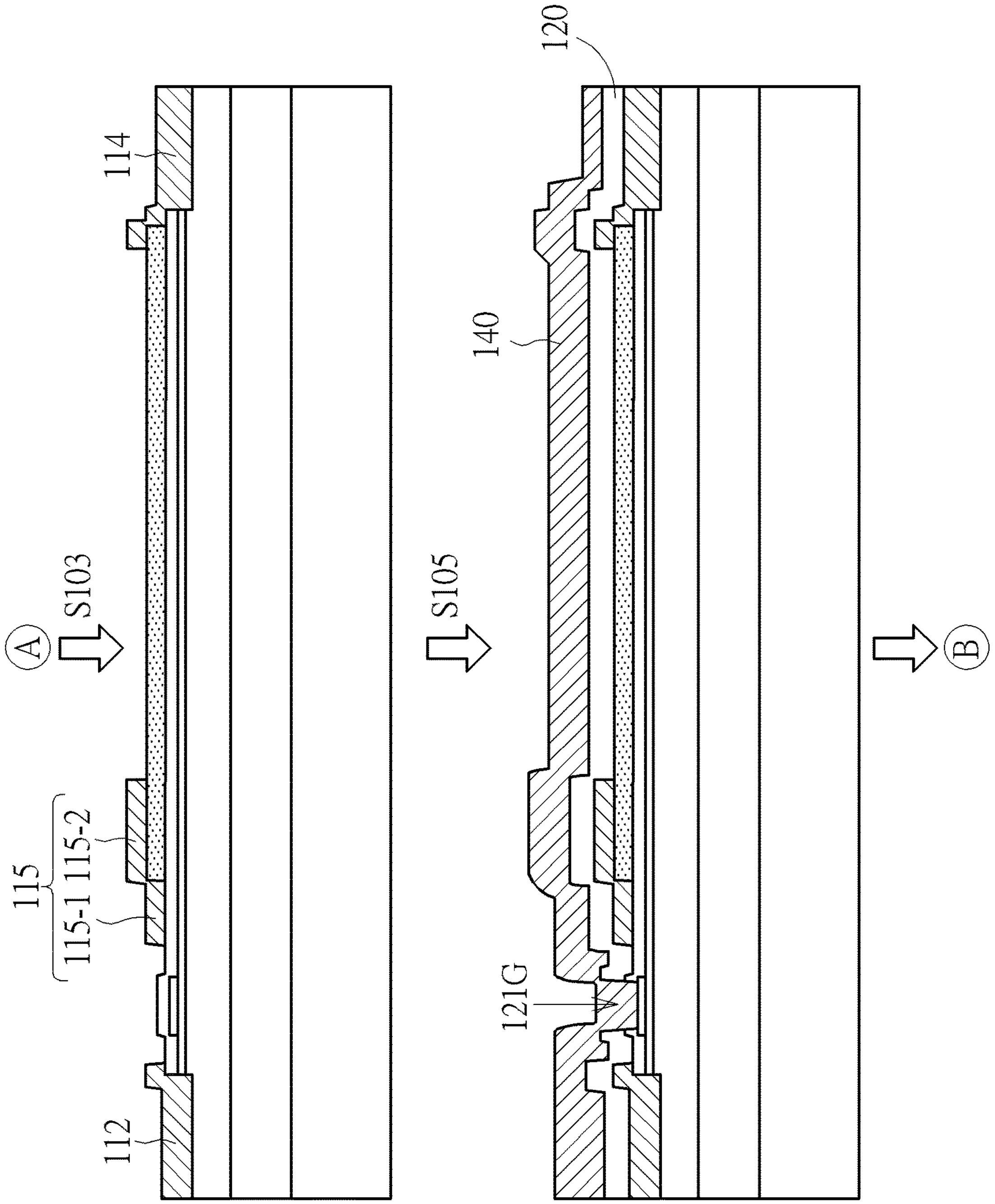

Referring to FIG. 8, at step S103, the first conductive material layer 130 is patterned by a photolithography and an etching processes to simultaneously form a source electrode 112, a drain electrode 114 and a first field plate 115. In this embodiment, the patterned dielectric layer 113 is extended continuously from the first field plate 115 to the drain electrode 114. A portion of the drain electrode 114 is extended from the right side of the patterned dielectric layer 113 to the top surface of the patterned dielectric layer 113. The first field plate 115 is extended continuously from the left side of the patterned dielectric layer 113 to the top surface of the patterned dielectric layer 113, thereby having a step in height. A first portion 115-1 of the first field plate 115 is on the semiconductor barrier layer 107 and abuts the left side of the patterned dielectric layer 113. A second portion 115-2 of the first field plate 115 is on the top surface of the patterned dielectric layer 113. Therefore, the first portion 115-1 and the second portion 115-2 of the first field plate 115 provide the effect of two field plates. In another embodiment, referring to FIG. 4, the patterned dielectric layer 113 includes a first dielectric segment 113-1 and a second dielectric segment 113-2. When the first conductive material layer 130 is patterned, the first field plate 115 is formed to be continuously extended from the left side of the first dielectric segment 113-1 to the top surface thereof, and another field plate 117 is simultaneously formed to be continuously extended from the left side of the second dielectric segment 113-2 to the top surface thereof. The field plate 117 is located between the first field plate 115 and the drain electrode 114.

Still referring to FIG. 8, at step S105, a second dielectric layer 120 is deposited to conformally cover the patterned dielectric layer 113, the first field plate 115, the source electrode 112, the drain electrode 114, the semiconductor cap layer 109 and the first dielectric layer 110, so that the second dielectric layer 120 has an undulating surface profile with ups and downs. According to some embodiments of the present disclosure, the dielectric constant of the patterned dielectric layer 113 is higher than that of the second dielectric layer 120. In one embodiment, the composition of the second dielectric layer 120 is, for example, silicon oxide. Next, a gate contact hole 121G is formed in the second dielectric layer 120 and the first dielectric layer 110 by an etching process to expose the semiconductor cap layer 109. Afterwards, a second conductive material layer 140 is conformally deposited on the second dielectric layer 120, and fills up the gate contact hole 121G. In some embodiments, the composition of the second conductive material layer 140 is, for example, a metal, polysilicon or a metal silicide. The metal is, for example, nickel (Ni), gold (Au), platinum (Pt), tungsten (W), titanium (Ti), aluminum (Al), molybdenum (Mo) or a multilayered stack of the aforementioned metal layers. The metal silicide is, for example, the silicide of the aforementioned metals.

Figure 9:
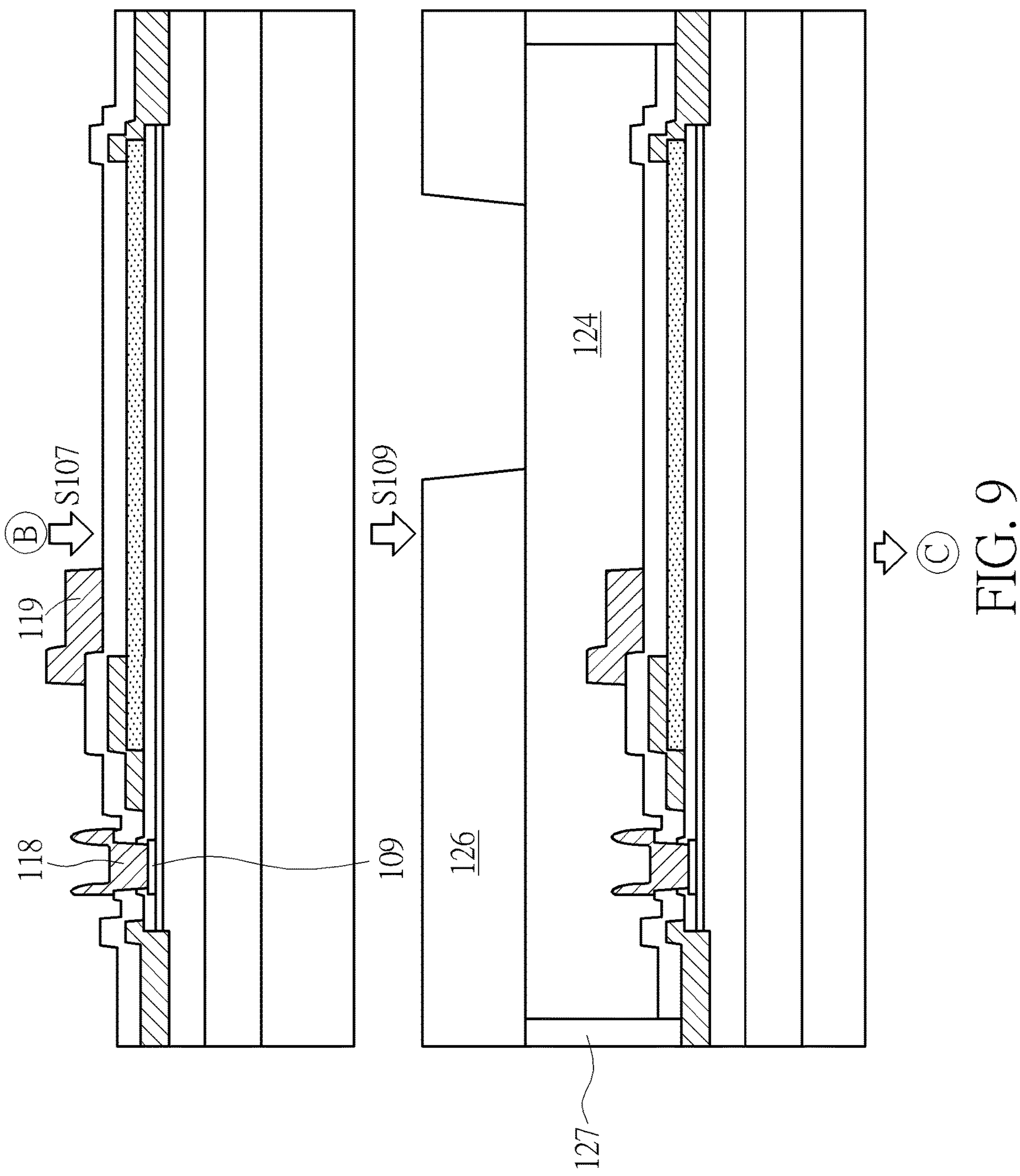

Referring to FIG. 9, at step S107, the second conductive material layer 140 is patterned by a photolithography and an etching processes to simultaneously form a gate electrode 118 and a second field plate 119. The second conductive material layer 140 and the second dielectric layer 120 are both conformally formed on the first field plate 115 and the patterned dielectric layer 113 to have an undulating surface profile with ups and downs. Accordingly, the second field plate 119 formed directly above the first field plate 115 and the patterned dielectric layer 113 also has a step in height, thereby having the effect of multiple field plates.

Still referring to FIG. 9, at step S109, an interlayer dielectric layer 124 is formed to cover the second dielectric layer 120, the gate electrode 118 and the second field plate 119. Then, multiple contact openings are formed in the interlayer dielectric layer 124 by an etching process to expose the source electrode 112 and the drain electrode 114. Afterwards, a conductive material layer is deposited on the interlayer dielectric layer 124, and fills up the contact openings in the interlayer dielectric layer 124 to form vias 127. Thereafter, the conductive material layer is patterned to form a wire pattern of the first metal layer 126.

Figure 10:
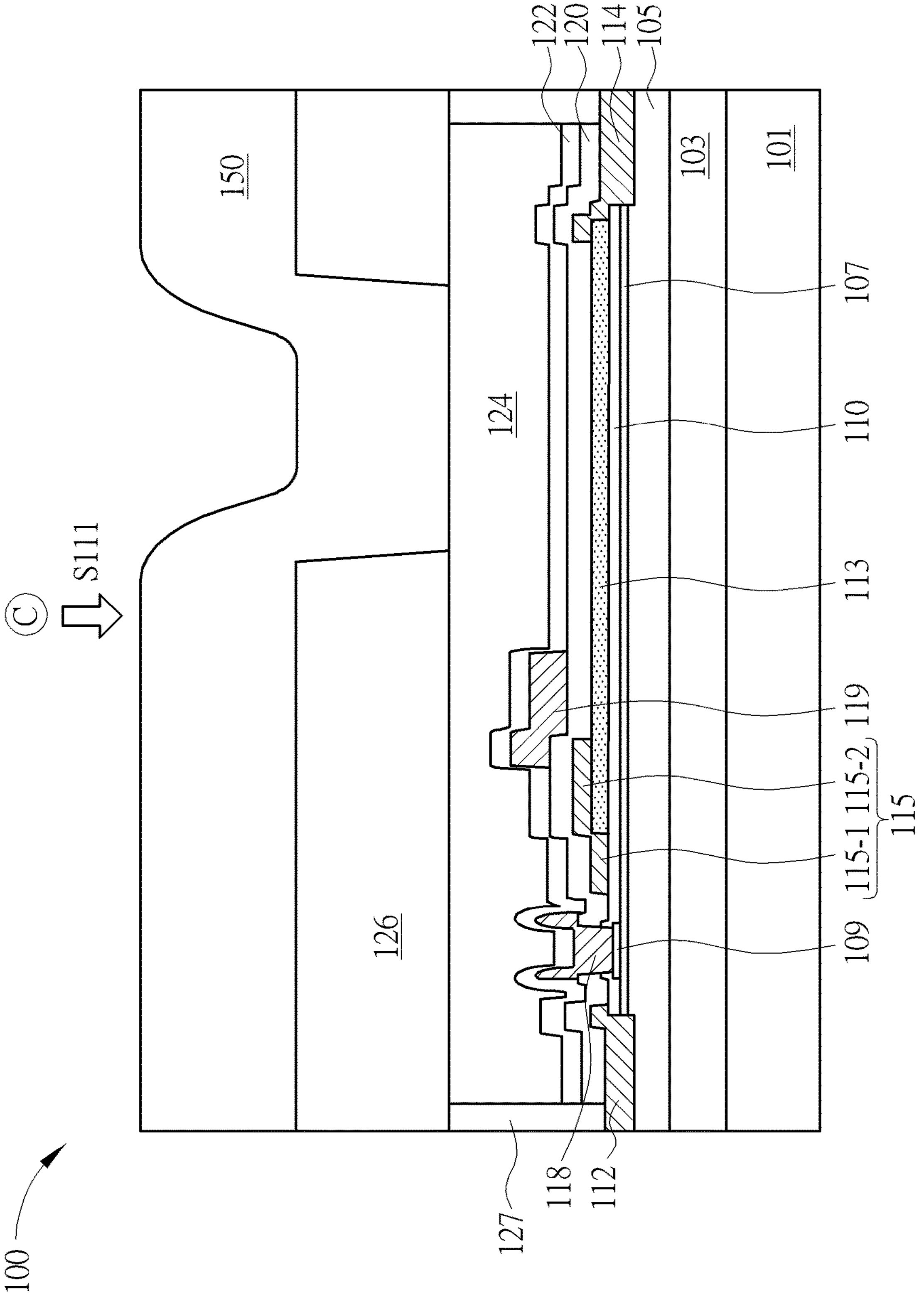

Referring to FIG. 10, at step S111, in one embodiment, a passivation layer 150 is formed to cover the first metal layer 126 and fill in the gaps of the first metal layer 126 to complete the IT 1 HEMT 100 of FIG. 1. In another embodiment, another interlayer dielectric layer may be formed to cover the first metal layer 126 and fill in the gaps of the first metal layer 126, and then multiple contact openings are formed in this interlayer dielectric layer by an etching process to expose the wire pattern of the first metal layer 126. Afterwards, a conductive material layer is deposited on this interlayer dielectric layer and fills up the contact openings therein to form vias. Next, the conductive material layer is patterned to form a wire pattern of a second metal layer. Moreover, the second metal layer may also be extended to other position to form a contact pad. Afterwards, a dielectric layer and a passivation layer may be formed on the second metal layer. Then, an opening for the contact pad may be formed in the dielectric layer and the passivation layer at the position corresponding to the contact pad, so that the HEMT may be electrically connected to an external circuit through vias in each layer, the first metal layer 126, the second metal layer and the contact pad.

According to some embodiments of the present disclosure, a patterned dielectric layer is disposed between the gate electrode and the drain electrode of a HEMT. The patterned dielectric layer is used for forming a field plate with a step in height, thereby achieving the effect of multiple field plates. This field plate with a step in height is formed by depositing and patterning a conductive material layer such as a metal layer. In addition, the dielectric constant of the patterned dielectric layer is higher than that of the dielectric layers around the patterned dielectric layer, thereby redistributing the electric field to reduce the maximum electric field intensity at the edge of the gate electrode and further improving the breakdown voltage of the HEMT. Moreover, according to some embodiments of the present disclosure, the source electrode, the drain electrode, and the field plate with a step in height are simultaneously formed in some process steps, and the gate electrode and another field plate with a step in height are also simultaneously formed in other process steps. Accordingly, there is no need to deposit and pattern an additional conductive material layer for forming the field plates, thereby reducing the number of photo-masks used in the fabrication of the HEMTs to reduce the manufacturing costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor, comprising:

a semiconductor channel layer disposed over a substrate;

a semiconductor barrier layer disposed on the semiconductor channel layer;

a cap layer disposed on the semiconductor barrier layer;

a source electrode, a gate electrode and a drain electrode, disposed over the semiconductor channel layer;

a first dielectric layer disposed on the semiconductor barrier layer;

a patterned dielectric layer disposed on the first dielectric layer and separated from the gate electrode and the drain electrode;

a first field plate, extended continuously from a side of the patterned dielectric layer to a top surface of the patterned dielectric layer, and having a step in height; and a second dielectric layer, disposed on the patterned dielectric layer, wherein the gate electrode is disposed on the second dielectric layer, and wherein the dielectric constant of the patterned dielectric layer is higher than the dielectric constant of the first dielectric layer and the dielectric constant of the second dielectric layer.

2. The high electron mobility transistor of claim 1, further comprising a second field plate disposed on the second dielectric layer, directly above the patterned dielectric layer, and having a step in height.

3. The high electron mobility transistor of claim 2, wherein the first field plate and the second field plate are electrically connected to the source electrode.

4. The high electron mobility transistor of claim 1, wherein the patterned dielectric layer is extended continuously from the first field plate to the drain electrode, and a portion of the drain electrode is extended from another side of the patterned dielectric layer to the top surface of the patterned dielectric layer.

5. The high electron mobility transistor of claim 1, wherein the patterned dielectric layer comprises a plurality of separate dielectric segments.

6. The high electron mobility transistor of claim 5, wherein the plurality of separate dielectric segments have the same composition, or have different dielectric constants respectively.

7. The high electron mobility transistor of claim 5, wherein the plurality of separate dielectric segments include a dielectric segment adjacent to the drain electrode, and a portion of the drain electrode is extended from a side of the dielectric segment to a top surface of the dielectric segment.

8. The high electron mobility transistor of claim 5, wherein the plurality of separate dielectric segments include a first dielectric segment and a second dielectric segment that is located between the first dielectric segment and the drain electrode, and the high electron mobility transistor further comprises another field plate extended continuously from a side of the second dielectric segment to a top surface of the second dielectric segment.

9. The high electron mobility transistor of claim 1, wherein the patterned dielectric layer comprises a stack of a plurality of dielectric material layers, and the plurality of dielectric material layers have different dielectric constants respectively.

* * * * *